United States Patent
Miyauchi et al.

(10) Patent No.: US 7,166,517 B1
(45) Date of Patent: Jan. 23, 2007

(54) SEMICONDUCTOR DEVICE AND METHOD OF MANUFACTURE THEREOF

(75) Inventors: Akihiro Miyauchi, Hitachi (JP); Yousuke Inoue, Tokai-mura (JP); Toshio Andou, Kunitachi (JP)

(73) Assignee: Hitachi, Ltd., Tokyo (JP)

( * ) Notice: Subject to any disclaimer, the term of this patent is extended or adjusted under 35 U.S.C. 154(b) by 262 days.

(21) Appl. No.: 10/398,525

(22) PCT Filed: Oct. 16, 2000

(86) PCT No.: PCT/JP00/07145

§ 371 (c)(1),
(2), (4) Date: Apr. 8, 2003

(87) PCT Pub. No.: WO02/33738

PCT Pub. Date: Apr. 25, 2002

(51) Int. Cl.
*H01L 21/8222* (2006.01)
(52) U.S. Cl. .................. 438/313; 438/314; 438/320
(58) Field of Classification Search ................ 438/300, 438/482, 486, 487, 314, 320, 313
See application file for complete search history.

(56) References Cited

U.S. PATENT DOCUMENTS

| | | | | |
|---|---|---|---|---|
| 4,224,520 A | * | 9/1980 | Greene et al. | 250/338.4 |
| 5,168,072 A | * | 12/1992 | Moslehi | 438/300 |
| 5,648,280 A | * | 7/1997 | Kato | 438/312 |
| 5,906,708 A | * | 5/1999 | Robinson et al. | 438/694 |
| 6,346,732 B1 | * | 2/2002 | Mizushima et al. | 257/382 |
| 6,362,063 B1 | * | 3/2002 | Maszara et al. | 438/307 |
| 6,396,147 B1 | * | 5/2002 | Adachi et al. | 257/758 |
| 6,399,450 B1 | * | 6/2002 | Yu | 438/300 |
| 6,780,725 B1 | * | 8/2004 | Fujimaki | 438/313 |
| 2002/0081861 A1 | * | 6/2002 | Robinson et al. | 438/742 |
| 2003/0219952 A1 | * | 11/2003 | Fujimaki | 438/322 |
| 2006/0003515 A1 | * | 1/2006 | Chang | 438/210 |

\* cited by examiner

*Primary Examiner*—Laura M. Schillinger
(74) *Attorney, Agent, or Firm*—Hogan & Hartson LLP

(57) ABSTRACT

The present invention provides a method of manufacturing a semiconductor device which includes an amorphous semiconductor film forming treatment of supplying a starting material gas containing germanium to a semiconductor substrate, thereby forming an amorphous semiconductor film containing the germanium on the semiconductor substrate. Further, it also provides a semiconductor device of a novel structure manufactured by the manufacturing method.

2 Claims, 13 Drawing Sheets

FIG.1

PRIOR ART

FIG.2

PRIOR ART

FIG.3

PRIOR ART

FIG.4

PRIOR ART

FIG.5

PRIOR ART

SEMICONDUCTOR DEVICE AND METHOD OF MANUFACTURE THEREOF

TECHNICAL FIELD

The present invention relates to a structure and a manufacturing technique of a semiconductor device.

BACKGROUND ART

Figure 1:
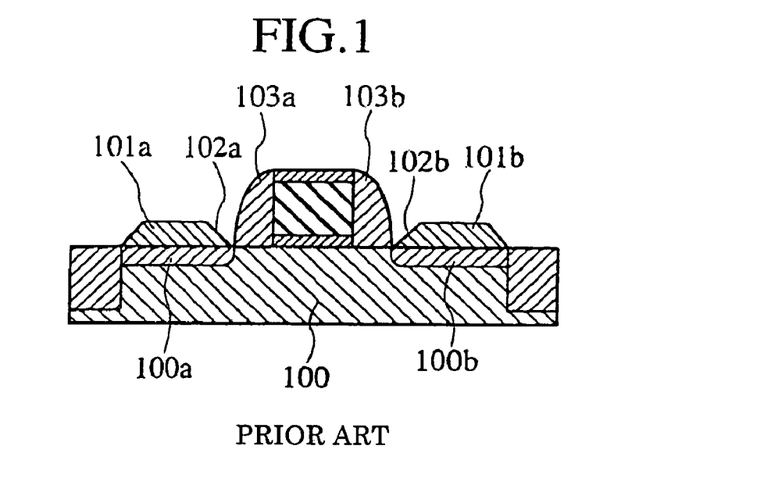
FIG. 1 is a fragmentary cross sectional view of an existent stacked structure MOS field effect transistor in which facets appear at a silicon layer on source and drain regions.

As the degree of integration has been increased and the size for individual devices has been decreased more and more, development for the technique of forming shallow junctions has been made. For example, in order to prevent increase in the sheet resistance of a source and drain diffusion layer caused by formation of the shallow junction, a source and drain stacking structure as shown in FIG. 1 in which silicon 101a and 101b are epitaxially grown selectively on source and drain regions 100a and 100b has been under development in MOS (Metal Oxide Semiconductor) transistors. In the source and drain stacked structure, crystal faces with small surface energy (for example, (311) face, (111) face, etc.) appear as facets 102a and 102b in each of silicon films 101a and 10b deposited on the source and drain regions 100a and 100b, respectively, on the sides of insulating films 103a and 103b. Such facets 102a and 102b form spike-like silicide regions extending through the source and drain regions 100a and 100b, for example, when silicide is formed on the silicon films 101a and 101b. When such spike-like silicide regions are present, leak current may possibly be formed between the source and drain regions 100a and 100b and the substrate 100.

Figure 2:
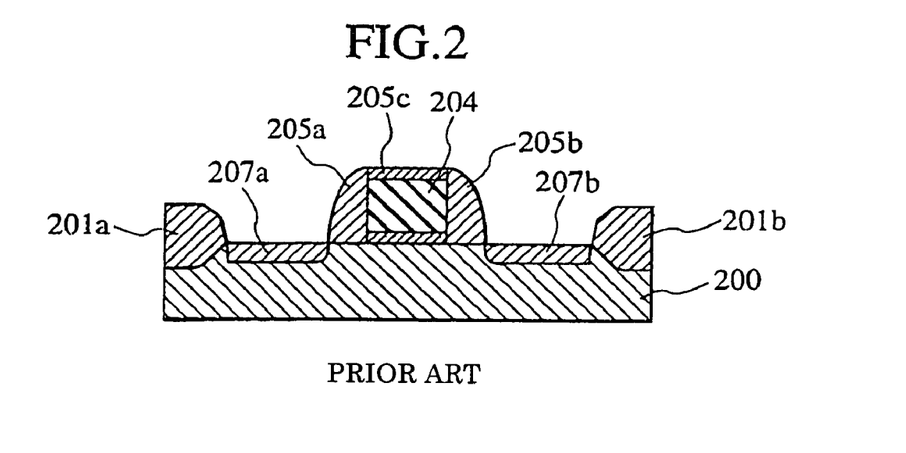
FIG. 2 is a fragmentary cross sectional view of a silicon substrate and a deposited film formed thereon in a manufacturing process (before film deposition of amorphous silicon) by an existent technique of manufacturing a stacked structure MOS field effect transistor.
Figure 3:
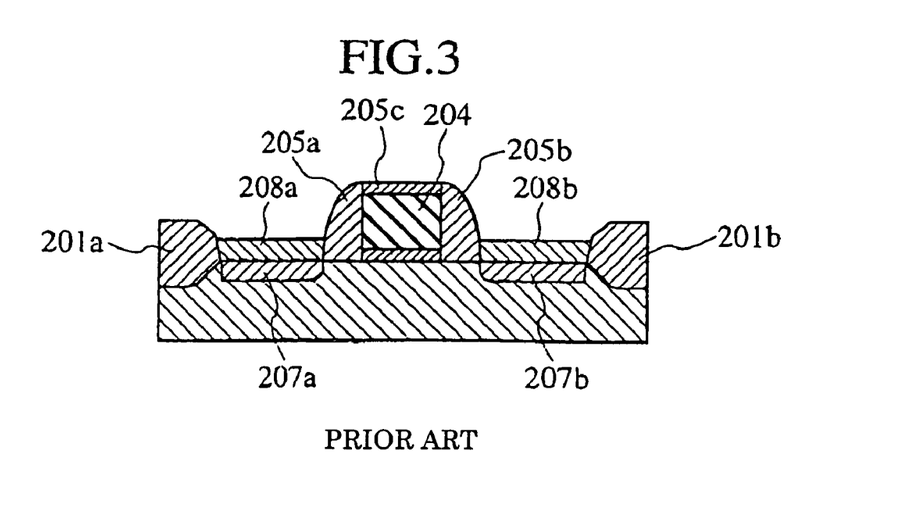
FIG. 3 is a fragmentary cross sectional view of a silicon substrate and a deposited film formed thereon in a manufacturing process (before film deposition of amorphous silicon) by an existent technique of manufacturing a stacked structure MOS field effect transistor.

In view of the above, to prevent occurrence of the facets in the silicon film on the source and drain regions, it has been studied to grow an amorphous silicon having no atom arrangement inherent to crystals (long range order) on the source and drain regions. As the concerned technique, a manufacturing technique for MOS transistors described in Japanese Patent Laid-Open Hei 9-82957 is known. In the manufacturing technique described in Japanese Patent Laid-Open Hei 9-82957, as shown in FIG. 2, a great amount of fluorine is left on the surface of an insulating film formed on a semiconductor substrate 200 (oxide films for device isolation 205a, 205b, 205c covering a gate electrode 204), thereby depositing amorphous silicon layers 208a and 208b selectively only on the source and drain regions 207a and 207b as shown in FIG. 3. Then, the amorphous silicon films 208a and 208b are subjected to a heat treatment for solid phase growing to form crystalline silicon films with no facets.

In addition to the MOS transistor described above, hetero-epitaxial base transistors and strained silicon channel transistors are known as the device involving the problem of facet generation.

Figure 4:
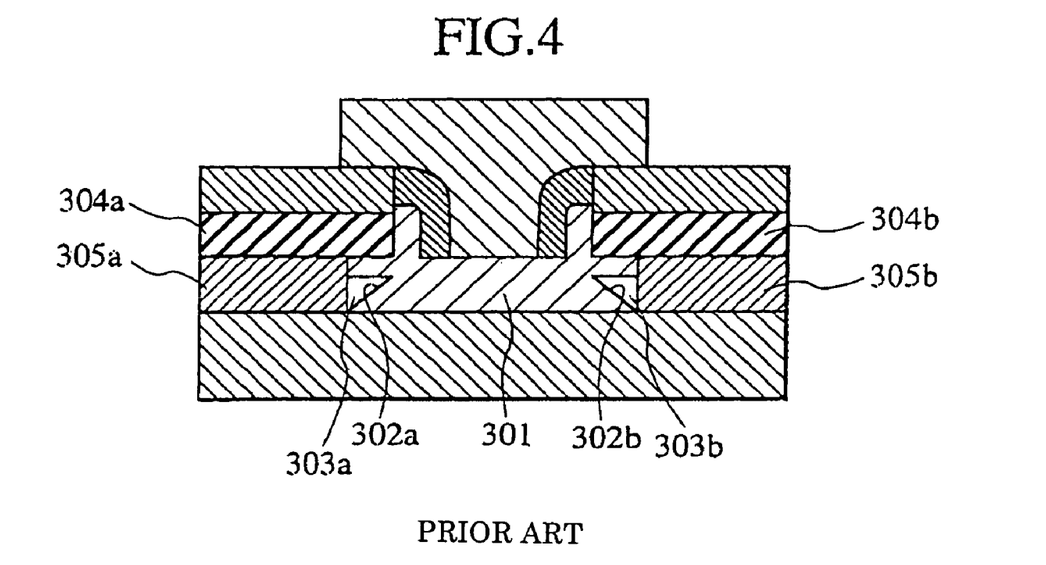
FIG. 4 is a fragmentary cross sectional view of an existent hetero-epitaxial base transistor in which facets appear at a silicon germanium film.

In a hetero-epitaxial base transistor, since facets 302a and 302b appear at the ends of a silicon germanium film 301 epitaxially grown on a region held between insulating films 305a and 305b as shown in FIG. 4, gaps 303a and 303b are formed between the silicon germanium film 301 and the insulating films 305a and 305b. Such gaps 303a and 303b will lower the reliability of the transistor.

Figure 5:
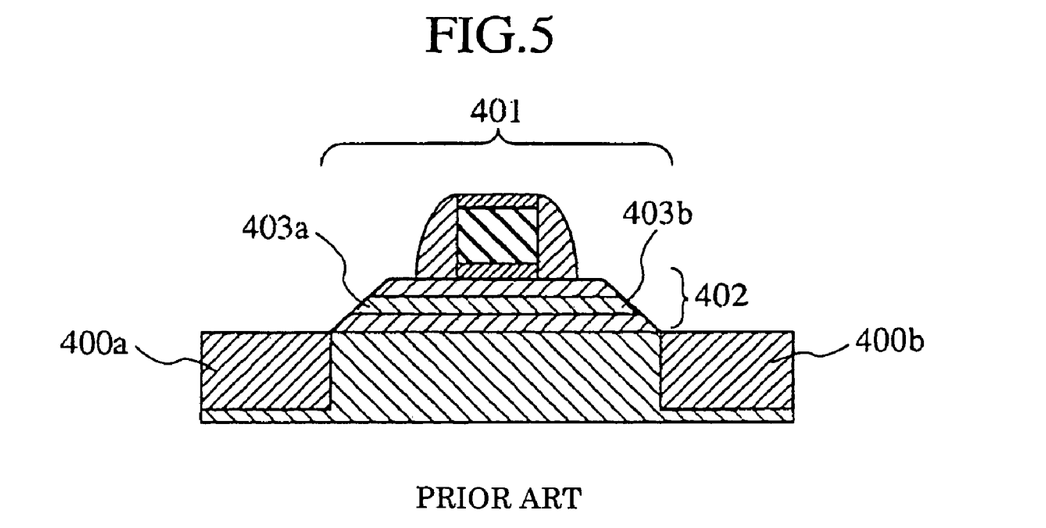
FIG. 5 is a fragmentary cross sectional view of an existent strained silicon channel transistor in which facets appear in a silicon multi-layered film.

Further, in a strained silicon transistor channel transistor, since facets 403a and 403b appear in a silicon multi-layered film 402 epitaxially grown in an active region 401 held between oxide films for device isolation 400a and 400b as shown in FIG. 5, a transistor forming region is narrowed. Accordingly, the degree of integration of transistors is lowered.

DISCLOSURE OF INVENTION

An object of the present invention is to provide a novel method of manufacturing a semiconductor device having no facets. Further, it intends to provide a semiconductor device having a novel structure manufactured thereby.

In order to attain the foregoing object, in the present invention, a starting material gas containing germanium is supplied to a semiconductor substrate in which an oxide film is formed on the side of a first surface, thereby forming an amorphous semiconductor film containing germanium on the first surface of the semiconductor substrate.

BEST MODE FOR CARRYING OUT THE INVENTION

Preferred embodiments according to the present invention will be described with reference to the accompanying drawings.

Figure 6:
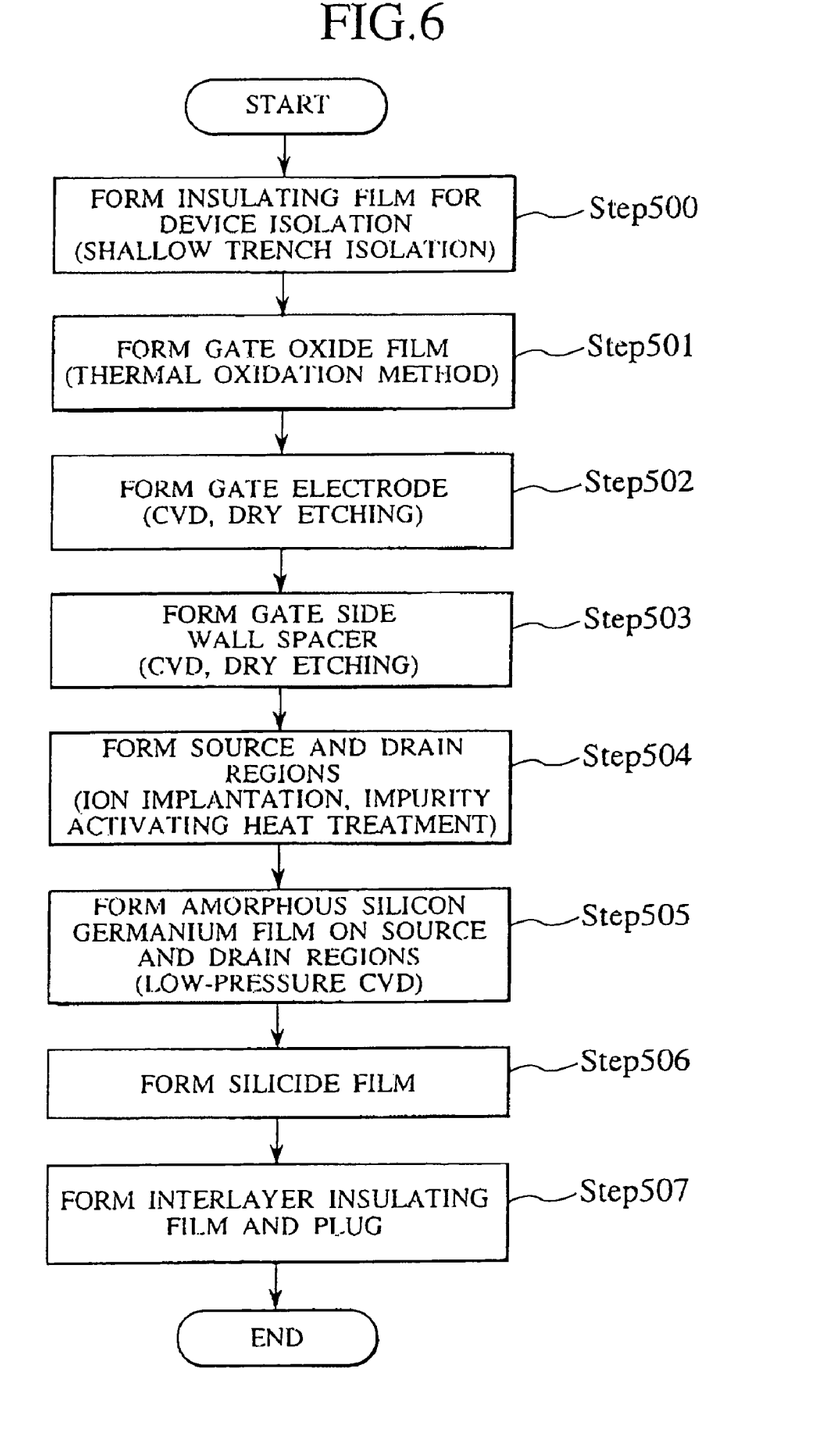
FIG. 6 is a view showing a flow chart for a method of manufacturing a transistor according to a first embodiment of the invention.

At first, description will be made to a method of manufacturing a transistor according to a first embodiment of the invention with reference to a flow chart shown in FIG. 6, where manufacturing steps of a stacked structure field effect transistor are mentioned as an example.

Figure 7:
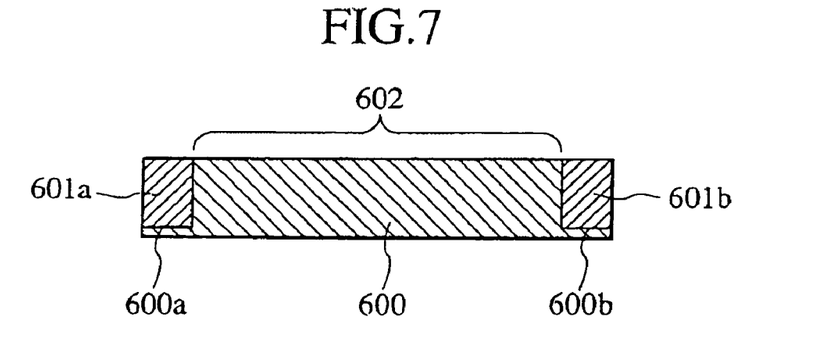
FIG. 7 is a fragmentary cross sectional view of a semiconductor substrate in a manufacturing process of a method of manufacturing a transistor according to a first embodiment of the invention.

First of all, as shown in FIG. 7, insulating films for device isolation 601a and 601b used for partitioning a transistor to be prepared below and other elements are formed by a shallow trench isolation method (Step 500). Specifically, trenches 600a and 600b in a predetermined pattern are formed by dry etching in the surface of a semiconductor substrate 600 and oxides 601a and 601b such as silicon dioxide are filled into the inside of the trenches 600a and 600b. In this case, a p-type silicon wafer (diameter: about 200 mm, thickness: about 0.75 mm) with a (100) face direction is used as the semiconductor substrate 600.

Figure 8:
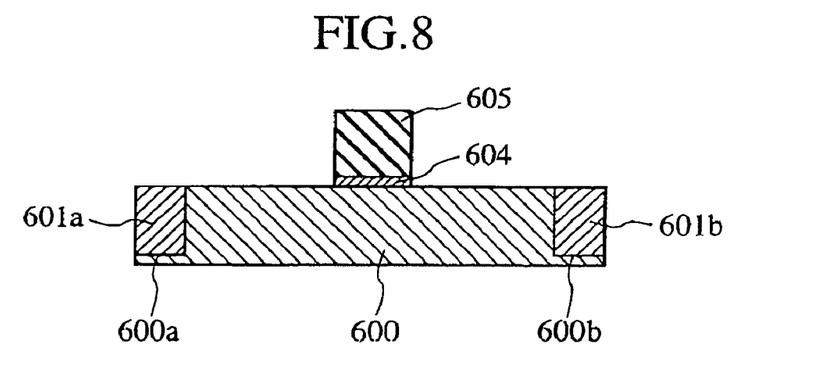
FIG. 8 is a fragmentary cross sectional view of a semiconductor substrate and a deposition film formed thereon in a manufacturing process of a method of manufacturing transistor according to a first embodiment of the invention.

After the insulating films for device isolation 601a and 601b are formed as described above, an oxide film of about 2.5 nm thickness (604 in FIG. 8) to serve as a gate oxide film is deposited, for example, by a thermal oxidation method in an active region 602 partitioned by the insulating films for device isolation 601a and 601b (Step 501). Further, a polycrystal silicon film of about 150 nm thickness is deposited on the gate oxide film 604, for example, by a chemical vapor deposition (CVD) method. Then, a resist pattern is formed on the polycrystal silicon film by photolithography. Then, the polycrystal silicon film is patterned into a gate electrode shape by dry etching using the resist pattern as a mask. Then, the resist pattern is removed. Thus a gate electrode 605 results on the gate oxide film 604 in the active region 602 as shown in FIG. 8 (Step 502).

Figure 9:
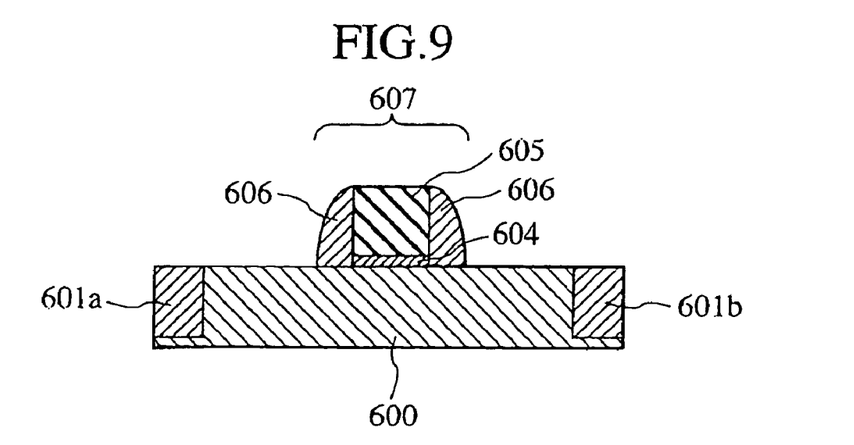
FIG. 9 is a fragmentary cross sectional view of a semiconductor substrate and a deposition film formed thereon in a manufacturing process of a method of manufacturing transistor according to a first embodiment of the invention.

Then, a silicon oxide film of about 100 nm thickness is deposited over the entire surface of the semiconductor substrate 600 by a CVD, and the silicon oxide film is fabricated by anisotropic dry etching. Thus, the silicon oxide film remains as a side wall spacer 606 on the side wall of the gate electrode 604 as shown in FIG. 9 (Step 503).

Figure 10:
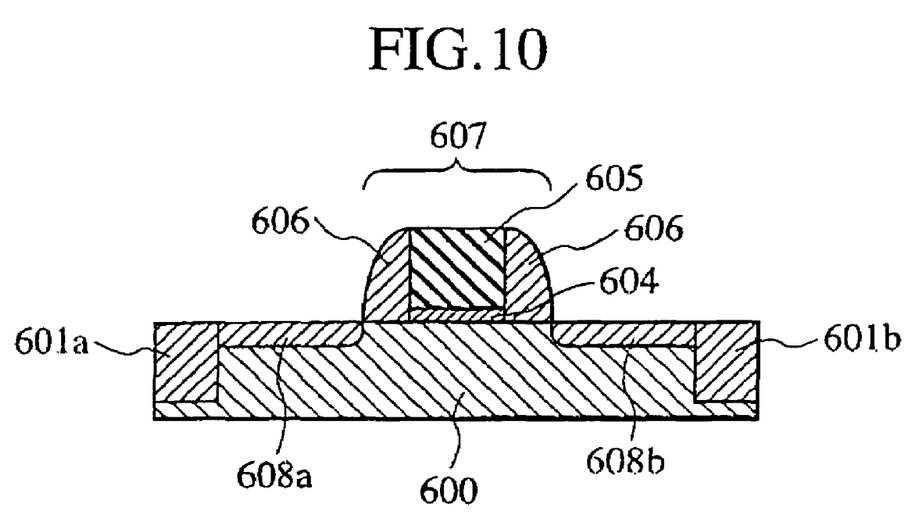
FIG. 10 is a fragmentary cross sectional view of a semiconductor substrate and a deposition film formed thereon in a manufacturing process of a method of manufacturing transistor according to a first embodiment of the invention.

Then, phosphorus ions, etc. are implanted into the semiconductor substrate 600. In this case, since the gate 607 functions as a mask, impurities are introduced only in the regions on both sides of the gate portion 607. Further, an impurity activating heat treatment is conducted at about 900° C. for about 30 sec. As shown in FIG. 10, this forms n-type diffusion layers 608a and 608b to serve as source and drain regions on both sides of the gate portion 607 (Step 504). After thus forming the source and drain regions 608a and 608b described above, the entire semiconductor substrate 600 is cleaned with an aqueous solution of hydrogen fluoride to thereby remove spontaneous oxide films and contaminants on the semiconductor substrate 600.

Figure 11:
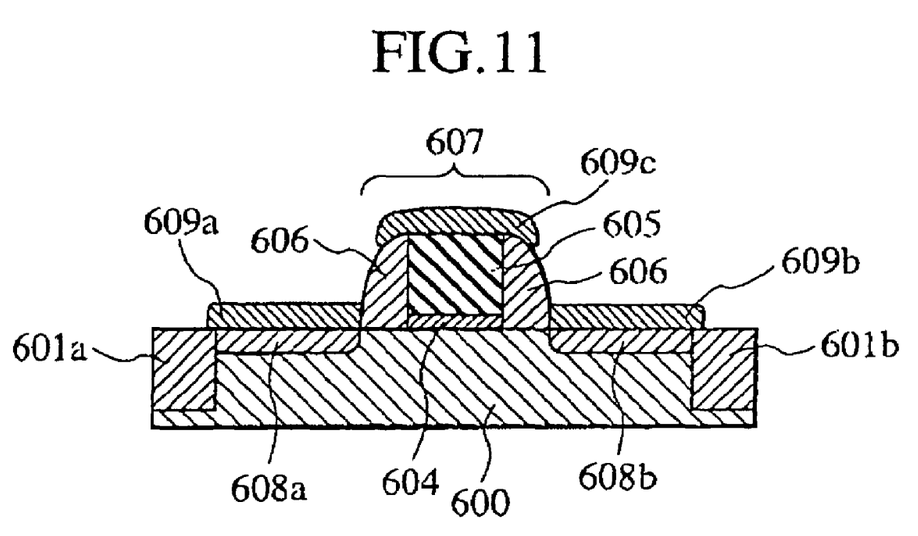
FIG. 11 is a fragmentary cross sectional view of a semiconductor substrate and a deposition film formed thereon in a manufacturing process of a method of manufacturing transistor according to a first embodiment of the invention.

Then, after drying the semiconductor substrate 600 cleaned, it is set in a reaction vessel of a low-pressure CVD apparatus. Then, a silane gas ($SiH_4$), a germane gas ($GeH_4$), and a hydrogen gas ($H_2$) are supplied as a starting material gas on the semiconductor substrate 600 while keeping the atmosphere in the reaction vessel at about 133 Pa and at about 450° C. The flow rate for each of the starting material gases is about 10 (ml/min) for the silane gas, about 0.5 (ml/min) for the germane gas and about 1 (1/min) for the hydrogen gas. Thus, as shown in FIG. 11, amorphous germanium films ($Si_{1-x}Ge_x$) 609a, 609b and 609c of about 30 nm thickness are selectively deposited on the source and drain regions 608a and 608b and on the gate electrode 204 (Step 505). The germanium compositional ratio X in the amorphous silicon germanium film deposited under the film deposition temperature used herein is 0.4.

Figure 12:
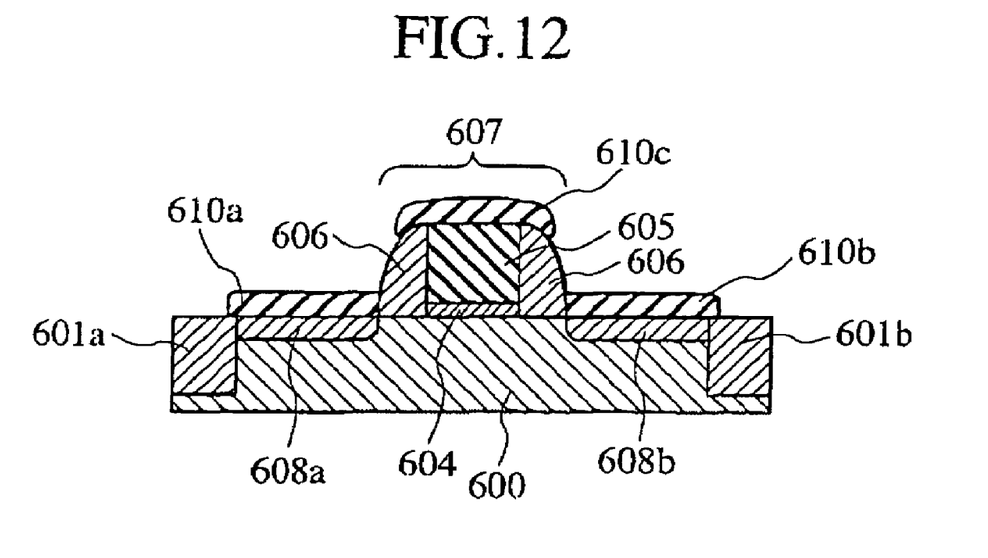
FIG. 12 is a fragmentary cross sectional view of a semiconductor substrate and a deposition film formed thereon in a manufacturing process of a method of manufacturing transistor according to a first embodiment of the invention.

Then, a cobalt film of about 50 nm thickness is formed on each of the amorphous silicon germanium films 609a, 609b and 609c by a sputtering method. Then, each of the amorphous silicon germanium films 609a, 609b, 609c and each of the cobalt films are reacted respectively by applying a heat treatment for about 30 sec to 60 sec in a nitrogen atmosphere at about 750° C. to 800° C. As shown in FIG. 12, this fallows silicide films 610, 610b, 610c to be formed on each of the source drain regions 608a, 608b and the gate electrode 204, respectively (Step 506). The cobalt film used for forming the silicide film may be replaced with, for example, a titanium film, nickel film, platinum film, vanadium film, palladium film or an alloy film thereof.

Figure 13:
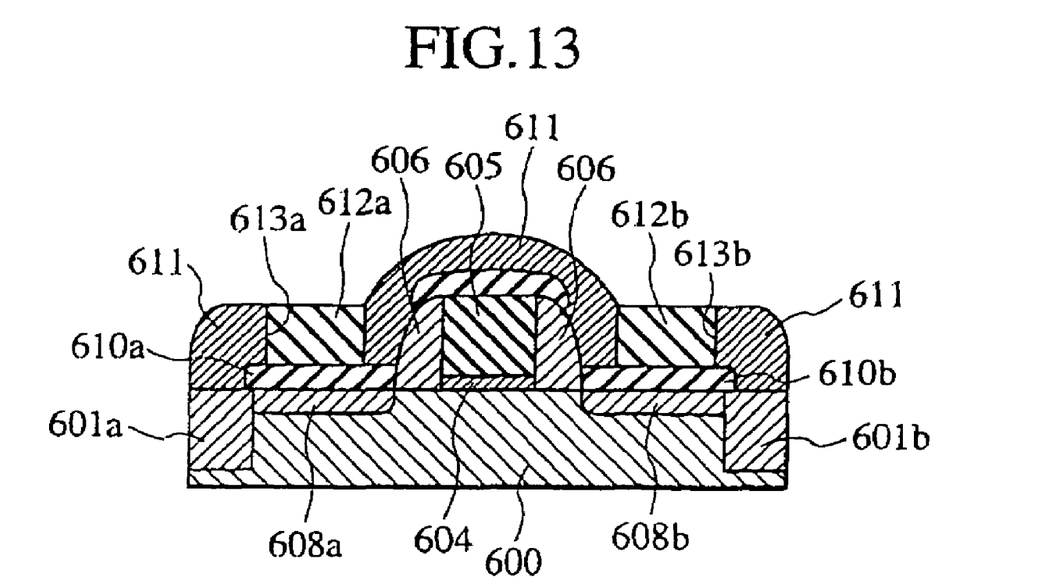
FIG. 13 is shows a fragmentary cross sectional view of a stacked structure field effect transistor manufactured by a method of manufacturing a transistor according to a first embodiment of the invention.

Then, a silicon oxide film is deposited entirely over the semiconductor substrate 600, for example, by a CVD method. Then, as shown in FIG. 13, via holes 613a and 613b reaching the silicide films 610a and 610b on the source and drains 608a and 608b are formed respectively in the silicon oxide film 611 by dry etching and, further, tungsten 612a and 612b are filled by a CVD or the like in the via holes. Thus, tungsten plugs 612a and 612b serving as a source electrode and a drain electrode are formed to complete a stacked structure field effect transistor.

In the method of manufacturing the transistor described above, addition of germane gas to the starting material gas for depositing the amorphous semiconductor film on the source and drain regions enables to selectively deposit the amorphous semiconductor film on the source and drain regions, without a surface treatment of leaving a great amount of fluorine in the regions other than the source and drain regions. In order to demonstrate this, a silicon germanium film was deposited actually on a semiconductor substrate formed with a source and drain regions using two gate portions as the mask under the same deposition conditions as those described above (film deposition pressure: about 133 Pa, film deposition temperature: about 450° C., silane gas flow rate: about 10 (ml/min), germane gas flow rate: about 0.5 (ml/min), and hydrogen gas flow rate: about 1 (l/min)), and the cross section of the film deposited was observed under a transmission electron microscope.

Figure 14:
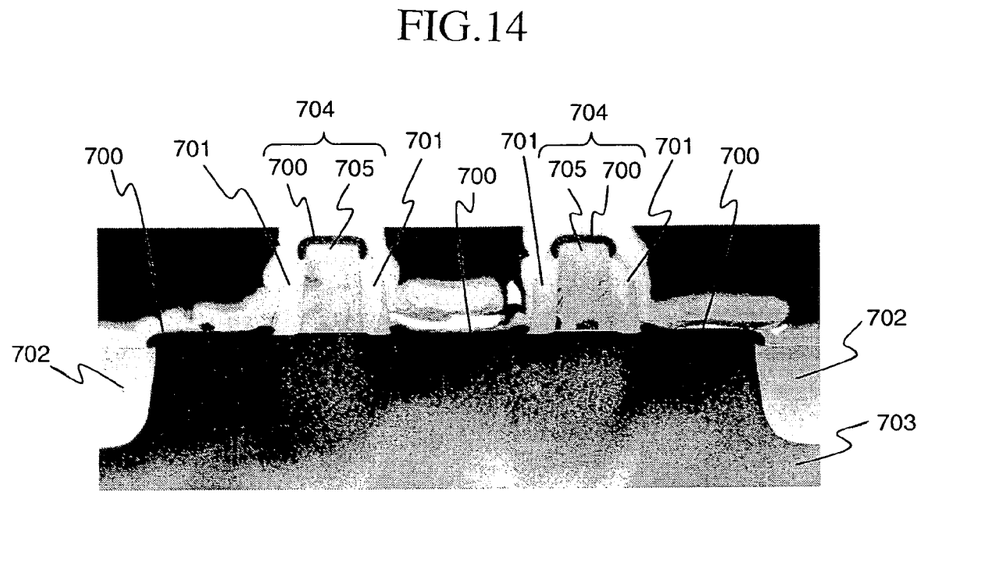
FIG. 14 shows transmission electron microscopic images of a stacked structure field effect transistor manufactured by a method of manufacturing a transistor according to a first embodiment of the invention.

As a result, as shown in FIG. 14, it has been found that a silicon germanium film 700 is not deposited on the surface of the insulating film for device isolation 702 and the surface of the insulating film 701 on the side wall of the gate electrode but are selectively deposited on the upper surfaces of the active regions other than the two gate portions 704 (that is, source and drain regions) and the two gate electrodes 705. Since the crystal structure is identical between the source and drain regions and other regions in the semiconductor substrate, the source and drain regions and other regions in the semiconductor substrate can not be distinguished from each other by the images made by the transmission electron microscope. Further, since the thickness of the gate insulating film is about 2.5 nm, it cannot be photographed by the transmission electron microscope used herein.

When the silicon germanium film 700 on the source and drain regions was observed by increasing the magnifying factor of the transmission electron microscope, it has been found that both of a moire pattern and a trigonal black pattern appeared in the transmission electron microscopic image for the silicon germanium film 700 on the source and drain regions. Presence of the moire pattern in the portion of the transmission electron microscopic image means that a portion of the silicon germanium film on the source and drain regions is amorphous not having the atom arrangement inherent to crystals (long range order). On the other hand, presence of the trigonal black pattern portion of the transmission electron microscopic image means that a portion of the silicon germanium film 7 on the source and drain regions is crystals that have been subjected to solid phase growing.

Figure 15:
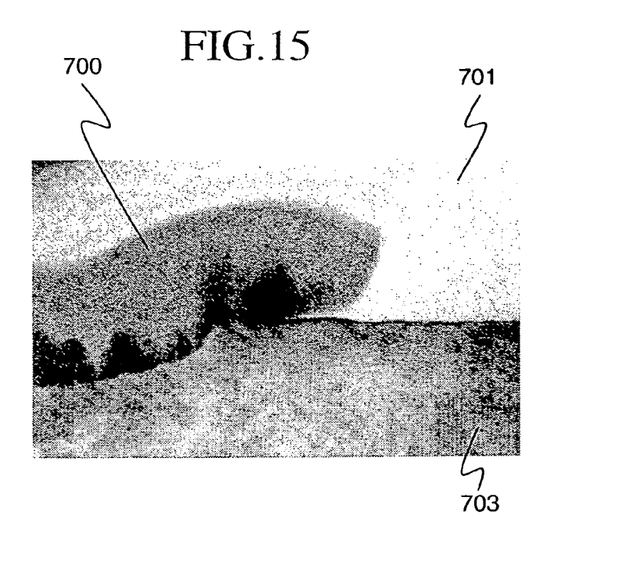
FIG. 15 shows enlarged images for a portion of contact between an insulating film and an amorphous silicon germanium film of the transmission electron microscopic images shown in FIG. 14.

Then, when the insulating film portion on the side wall of the gate electrode was observed while keeping the increased magnification factor of the transmission electron microscope, it has been confirmed, as shown in FIG. 15, that a moire pattern appeared at the end of the silicon germanium film 700 on the source and drain regions, and presence of facets inherent to crystals was not observed. That is, the end of the silicon germanium film 700 on the source and drain regions has a face of a shape along the insulating film 703 on the side wall of the gate electrode and the semiconductor substrate 701 and is in close contact at the surface with the insulating film 703 on the side wall of the gate electrode and the semiconductor substrate 701. On the other hand, the black pattern of a trigonal shape has been confirmed to be distributed mainly near the interface with respect to the semiconductor substrate 703.

From the result of the observation described above, it was demonstrated that the stacked structure field effect transistor with no facets could be prepared by the method of manufacturing the transistor according to this embodiment, without applying a surface treatment of leaving a great amount of fluorine in the regions other than the source and drain regions. Actually, when a stacked structure field effect transistor with the thickness of the source and drain diffusion layer of about 20 nm was manufactured in accordance with the method of manufacturing the transistor according to this embodiment, leak current expected to be attributable to spikes was not generated. It may be considered also from the result that a stacked structure field effect transistor with no facets can be prepared in accordance with the method of manufacturing the transistor according to this embodiment, without applying the surface treatment of leaving a great amount of fluorine in the regions other than the source and drain regions.

In the foregoings, the p-type silicon wafer is used as the semiconductor substrate but it is not restricted only thereto. For example, an n-type silicon wafer may be used instead of the p-type silicon wafer. However, in a case of using the n-type silicon wafer as a semiconductor substrate, it is necessary to form a p-type source and drain diffusion layer in the active region.

Figure 16:
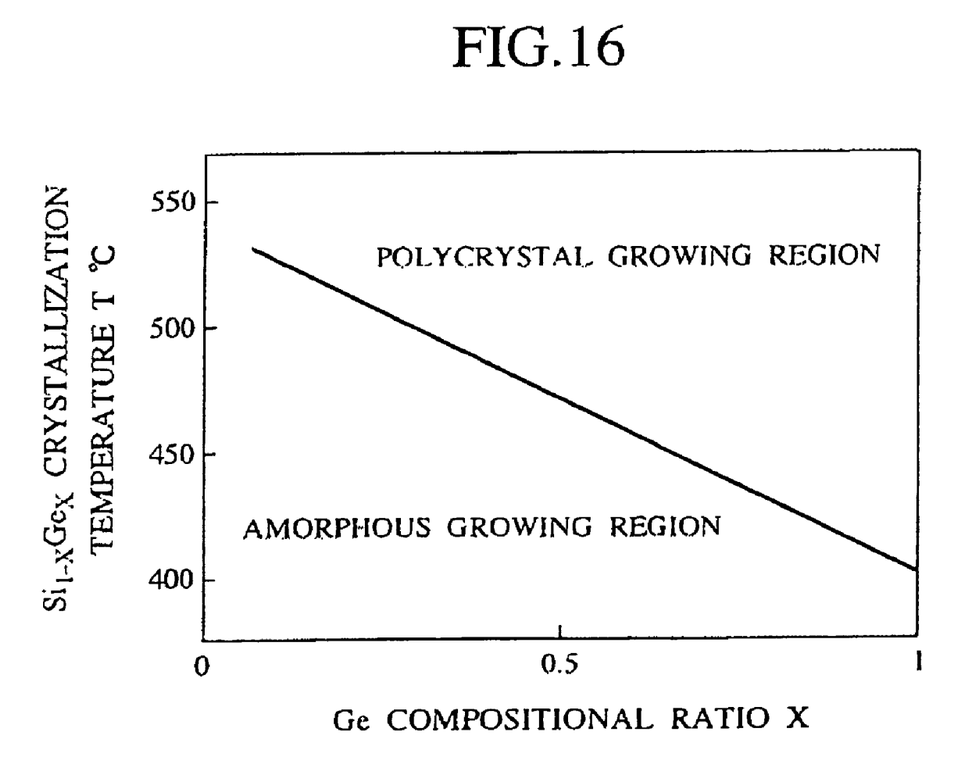
FIG. 16 is a graph showing a relation between a germanium compositional ratio and a crystallization temperature of an amorphous silicon germanium.

Further, in the foregoings, while the germanium compositional ratio X in the amorphous silicon germanium film ($Si_{1-x}Ge_x$) is set to 0.4, an amorphous silicon germanium film at a germanium compositional ratio different therefrom may be deposited on the source and drain regions. As shown in FIG. 16, since the amorphous silicon germanium ($Si_{1-x}Ge_x$) has such a characteristic that the crystallization temperature T is lower as the germanium compositional ratio X is greater, it is necessary, for example, to lower the film deposition temperature in a case where the germanium compositional ratio X of the amorphous silicon germanium film ($Si_{1-x}Ge_x$) to be deposited on the source and drain regions is made greater. More specifically, it is necessary that a crystallization temperature T for amorphous silicon germanium having the same germanium compositional ratio as the germanium compositional ratio X for the amorphous silicon germanium film ($Si_{1-x}Ge_x$) to be deposited on the source and drain regions is determined from FIG. 16 and a temperature lower than the crystallization temperature is set as a film deposition temperature.

In the foregoings, the method of manufacturing the transistor according to the present invention has been described to a case of applying to the manufacturing steps of the stacked field effect transistor, but the transistor manufacturing method according to the invention is applicable also to the manufacturing steps of other semiconductor devices for which prevention for the occurrence of facets is desired. For example, it can be applied also to the manufacturing steps of hetero-epitaxial base transistors and strained silicon channel transistors. Further, (1) manufacturing steps for the hetero-epitaxial base transistor and (2) manufacturing steps for the strained silicon channel transistors will be described below as other embodiments of the invention.

(1) Manufacturing steps for the hetero-epitaxial base transistor

Figure 17:
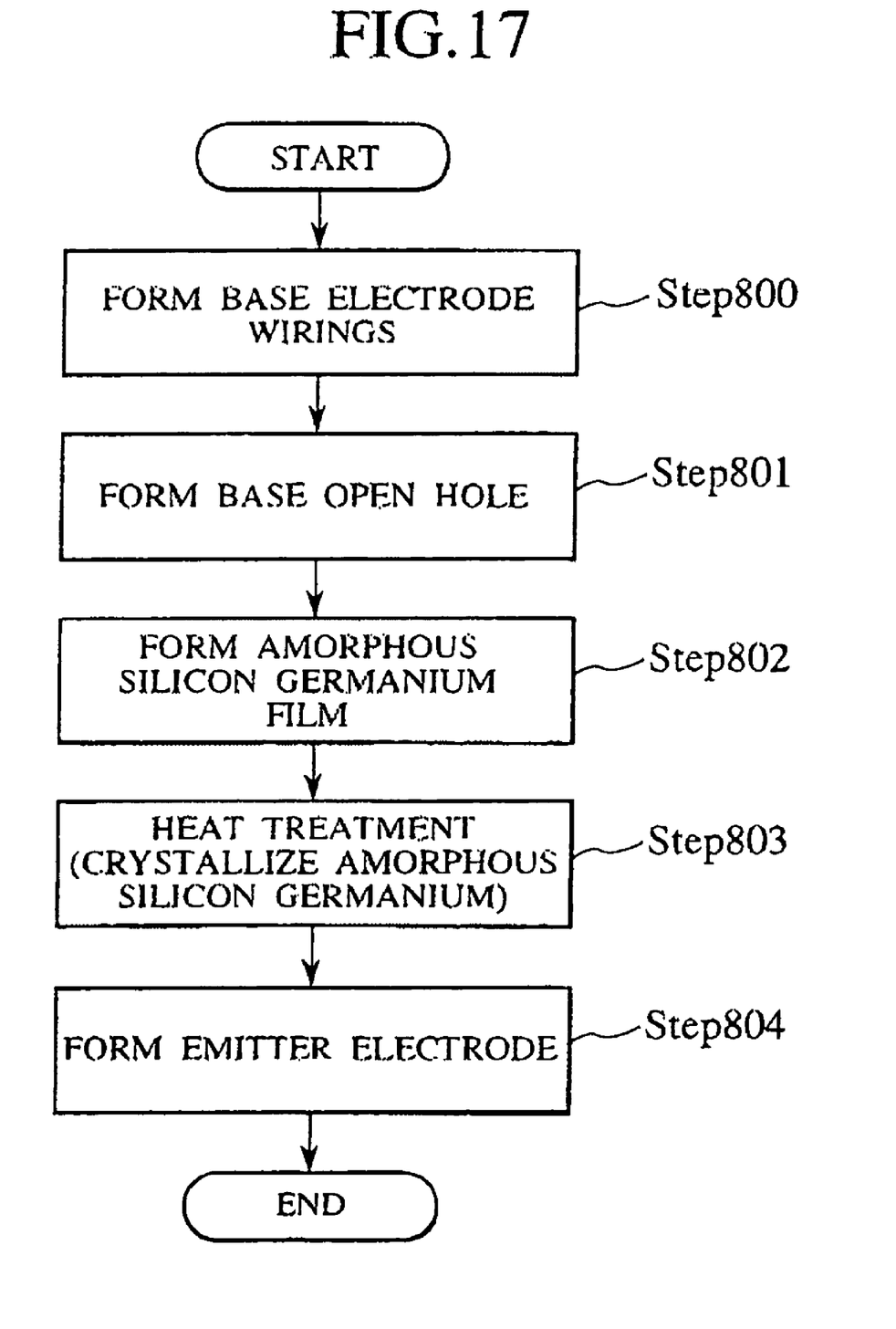
FIG. 17 is a view showing a flow chart for a method of manufacturing a transistor according to a second embodiment of the invention.

FIG. 17 is a flow chart for manufacturing steps of a hetero-epitaxial base transistor according to a second embodiment of the present invention. In this embodiment, a p-type silicon wafer having a (100) face direction (diameter: about 200 mm, thickness: about 0.75 mm) is used as a semiconductor substrate.

Figure 18:
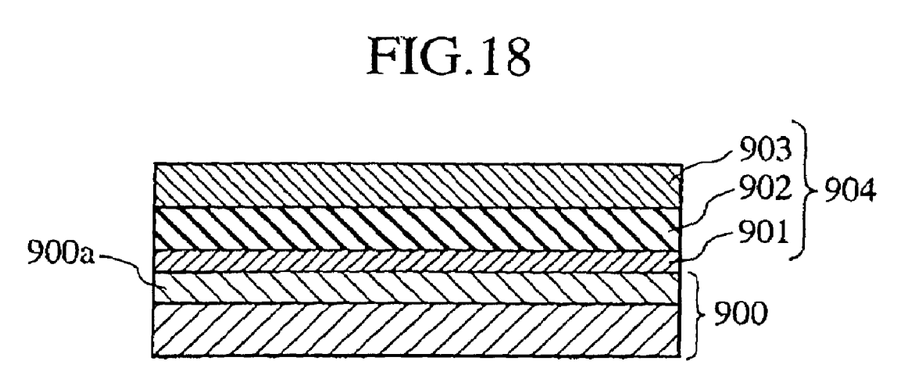
FIG. 18 is a fragmentary cross sectional view of a semiconductor substrate and a deposited film formed thereon in a manufacturing process of a method of manufacturing a transistor according to a second embodiment of the invention.

At first, phosphorus ions are implanted to a semiconductor substrate (900 in FIG. 18) from the surface thereof to the depth of about 100 nm, to form an n-type region (900a in FIG. 18). Then, a silicon oxide film of about 20 nm thickness (901 in FIG. 18) is deposited by a thermal CVD method on the semiconductor substrate. A polycrystal silicon film of about 100 nm thickness containing an impurity (boron) (902 in FIG. 18) is deposited on the silicon oxide film by a thermal CVD method. The polycrystal silicon film 902 serves as a base lead electrode of a hetero-epitaxial base transistor. Further, a silicon oxide layer of about 100 nm thickness (903 in FIG. 18) is deposited by a thermal CVD method (Step 800) on the polycrystal silicon film 902. As a result, a laminate film 904 comprising three layers 901, 902, and 903 is formed on the semiconductor substrate 900 as shown in FIG. 18.

Figure 19:
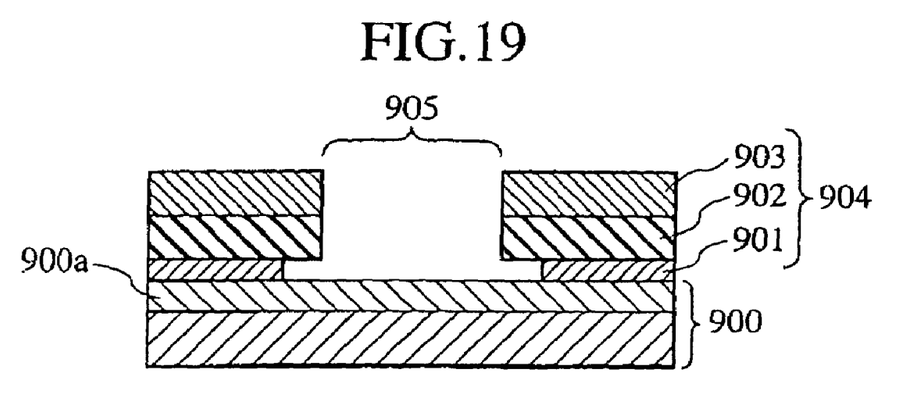
FIG. 19 is a fragmentary cross sectional view of a semiconductor substrate and a deposited film formed thereon in a manufacturing process of a method of manufacturing a transistor according to a second embodiment of the invention.

Then, a resist pattern is formed by photolithography on the silicon oxide layer 903 and portions of the silicon oxide film 903 and the polycrystal silicon film 902 are removed by dry etching using the resist pattern as a mask. A portion of the silicon oxide film 901 exposed by the process is removed by wet etching using an aqueous solution of hydrogen fluoride, thereby forming a base open hole 905 in the laminate film 904 (Step 801) as shown in FIG. 19.

Figure 20:
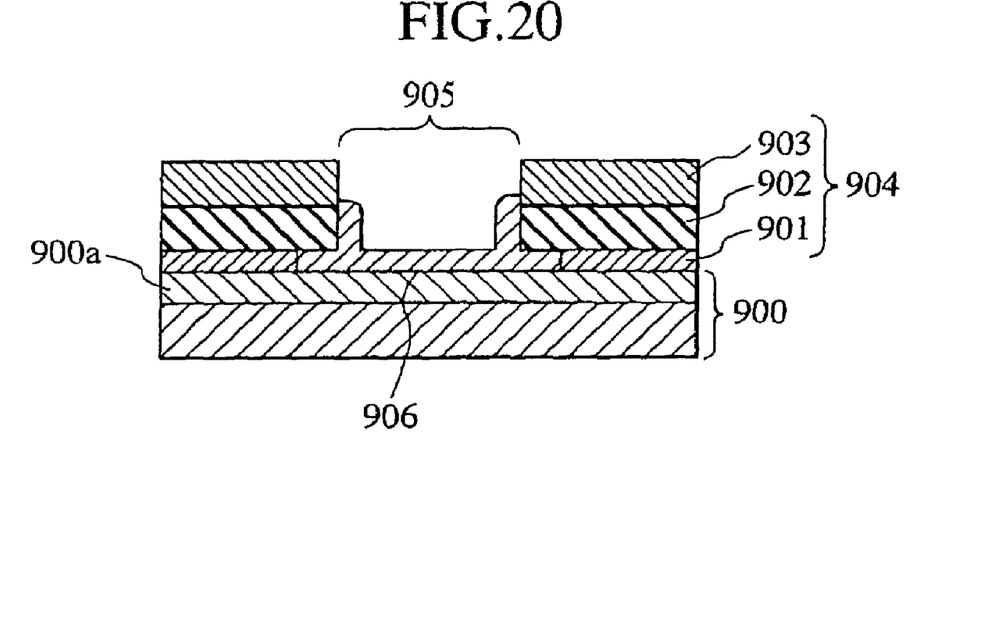
FIG. 20 is a fragmentary cross sectional view of a semiconductor substrate and a deposited film formed thereon in a manufacturing process of a method of manufacturing a transistor according to a second embodiment of the invention.

Then, the semiconductor substrate 900 is set in a reaction vessel of a low-pressure CVD apparatus. Then, in the same manner as described above, a silane gas ($SiH_4$), a germane gas ($GeH_4$) and a hydrogen gas ($H_2$) are supplied as a starting material gas to the semiconductor substrate 900 while keeping the atmosphere in the reaction vessel at about 133 Pa and at about 450° C. The flow rate for each of the starting material gases is at about 10 (ml/min) for the silane gas, about 0.5 (ml/min) for the germane gas and about 1 (l/min) for the hydrogen gas. Then, as shown in FIG. 20, an amorphous silicon germanium film ($Si_{1-X}Ge_X$) 906 of about 20 nm thickness is selectively deposited only on the semiconductor substrate 900 and the polycrystal silicon film 902 exposed as the inner wall of the base open film ($Si_{1-X}Ge_X$) 906 (Step 802). Since facets inherent to crystals can not be present in the amorphous silicon germanium, the amorphous silicon germanium film 906 deposited in this step is filled between the semiconductor substrate 900 and the polycrystal silicon film 902 without forming gaps between the amorphous silicon germanium film 906 and the side wall of the silicon oxide film 901.

Then, the amorphous silicon germanium film 901 is crystallized by applying a heat treatment for about 2 min in a nitrogen atmosphere at about 650° C. (Step 803).

Figure 21:
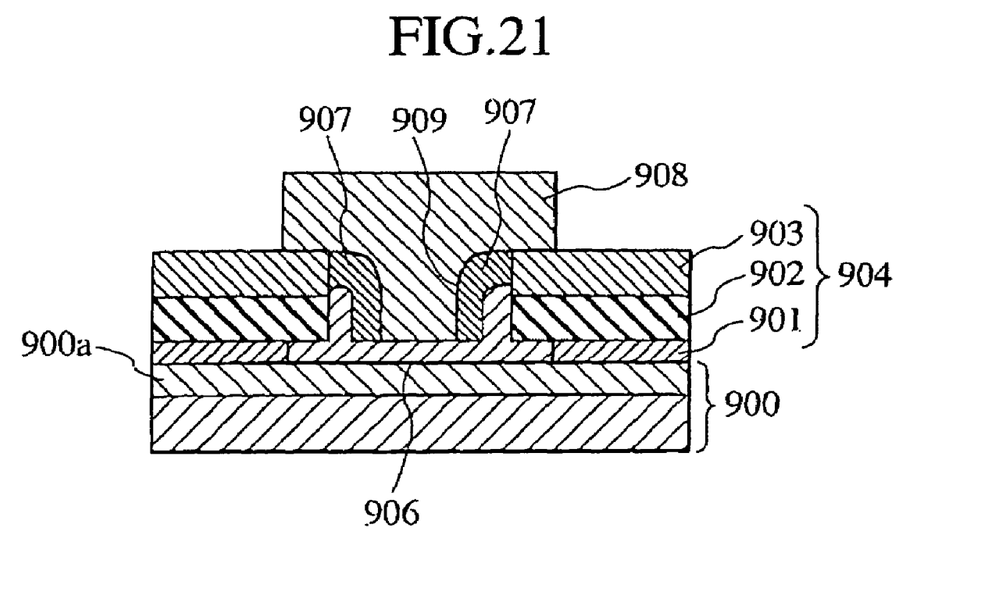
FIG. 21 is a fragmentary cross sectional view of a hetero-epitaxial base transistor manufactured by a method of manufacturing a transistor according to a second embodiment of the invention.

Then, silicon oxide is formed over the entire region on the semiconductor substrate 900. Then, the silicon oxide film 907 other than the emitter region is removed. Thus, the silicon oxide film (907 in FIG. 21) is left only on the wall surface of the emitter opening (909 in FIG. 21). Finally, as shown in FIG. 21, an emitter electrode 908 is formed by filling a p-type polycrystal silicon film into the inside of the emitter opening 909 by a CVD method. Thus, a hetero-epitaxial base transistor is completed.

According to the method of manufacturing the transistor described above, since the amorphous silicon germanium film having no atom arrangement inherent to the crystals is deposited in the base open hole and is crystallized, a silicon germanium not forming a gap between amorphous silicon germanium film and the silicon oxide film exposed as the inner wall surface of the base open hole can be formed. Accordingly, a hetero-epitaxial base transistor of high reliability can be manufactured. In order to demonstrate this, when a hetero-epitaxial base transistor was manufactured actually by the method of manufacturing a transistor according to this embodiment and the cross section was observed by a transmission electron microscope, occurrence of gaps was not observed between the silicon germanium film and the insulating film, which is different from the existent transistor shown in FIG. 4. That is, it has been confirmed that a hetero-epitaxial base transistor of high reliability can be manufactured by the method of manufacturing the transistor according to this embodiment.

While only the silane gas, the germane gas and the hydrogen gas are used as the starting material gas for the amorphous silicon germanium film in this embodiment, other gases may be optionally added in addition to the gases described above. For example, when a propane gas is added further to the starting material gas for the amorphous silicon germanium film, carbon-containing amorphous silicon germanium film is formed. Accordingly, stresses formed in the silicon germanium film after solid phase growing can be moderated. As a result, since occurrence of crystal defects in the silicon germanium film just after solid phase growing is suppressed, the reliability of the hetero-epitaxial base transistor can be improved further.

Further, while the germanium compositional ratio X in the amorphous germanium film ($Si_{1-X}Ge_X$) is set to 0.4 in this embodiment, an amorphous silicon germanium film at a germanium compositional ratio different therefrom may also be deposited. In such a case, in the same manner as described above, it is necessary that a crystallization temperature T for amorphous silicon germanium having the same germanium compositional ratio as the germanium compositional ratio X for the amorphous silicon germanium film ($Si_{1-X}Ge_X$) to be deposited on the source and drain regions is determined from FIG. 16 and a temperature lower than the crystallization temperature is set as a film deposition temperature of the amorphous silicon germanium film.

(2) Manufacturing steps for strained silicon channel transistor

Figure 22:
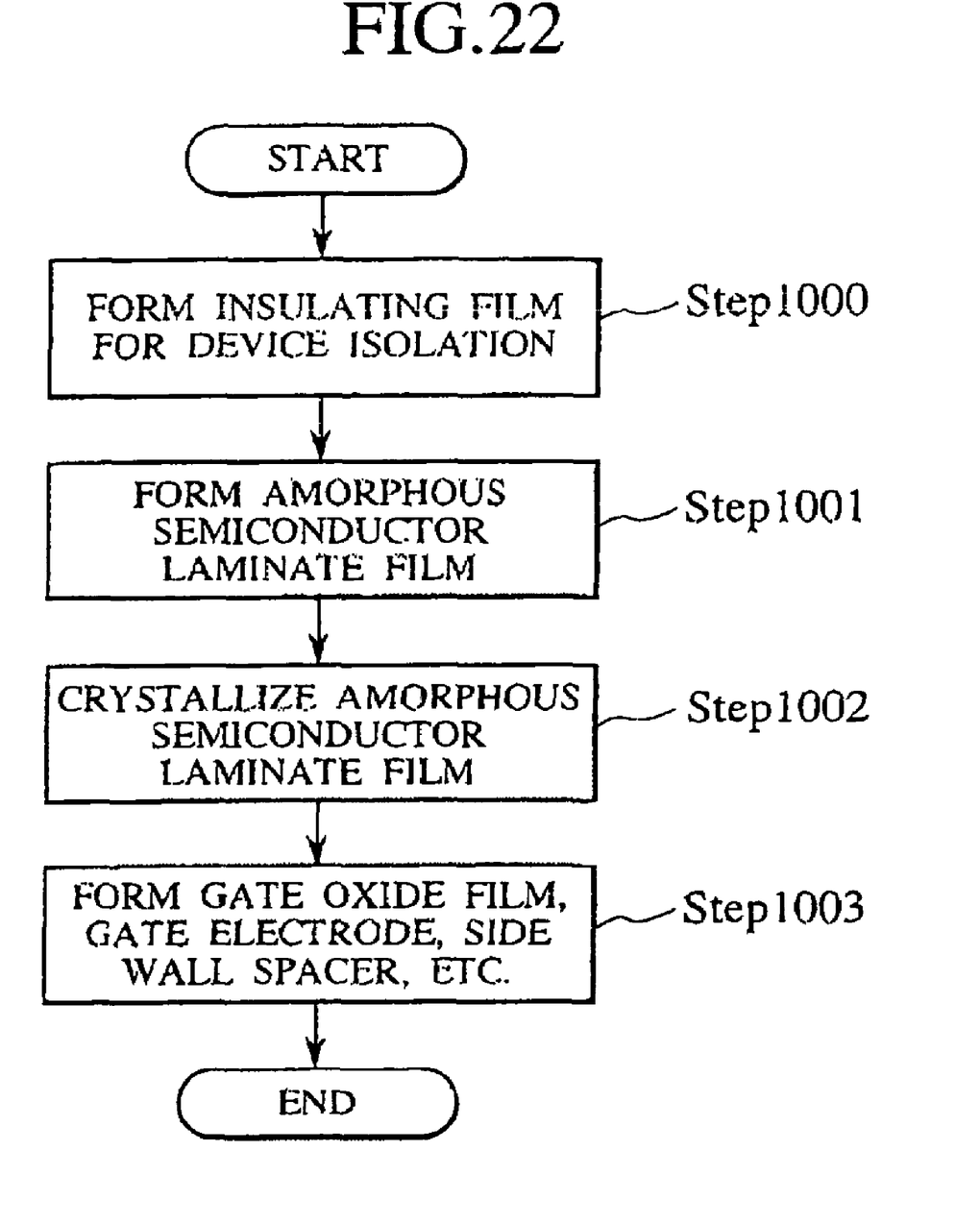
FIG. 22 is a view showing a flow chart for a method of manufacturing a transistor according to a second embodiment of the invention.

FIG. 22 is a flow chart for manufacturing steps of a strained silicon channel transistor according to a third embodiment of the present invention. In this process, a p-type silicon wafer having a (100) face direction (diameter: about 200 mm, thickness: about 0.75 mm) is used as a semiconductor substrate.

Figure 23:
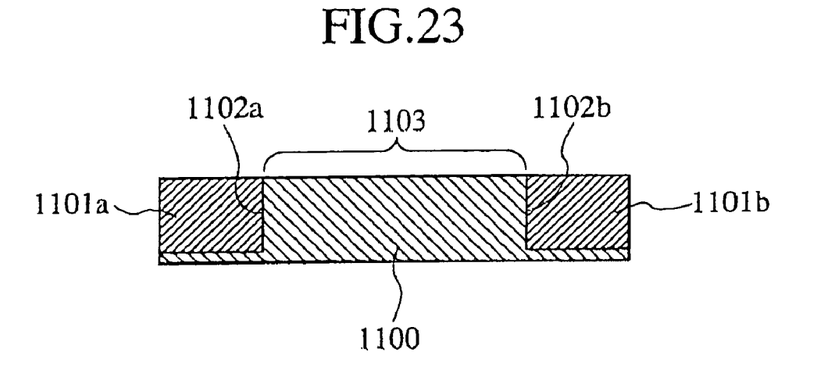
FIG. 23 is a fragmentary cross sectional view of a semiconductor substrate and a deposited film formed thereon in a manufacturing process of a method of manufacturing a transistor according to a third embodiment of the invention.

At first, as shown in FIG. 23, insulating films for device isolation 1101a and 1101b for partitioning the transistor to be prepared below from other elements are formed by a shallow trench burying method (Step 1000). Specifically, trenches 1102a and 1102b of a predetermined pattern are formed by dry etching in the surface of the semiconductor substrate 1100 and oxides 1101a and 1102b such as silicon dioxide are filled in the trenches 1102a and 1102b.

Figure 24:
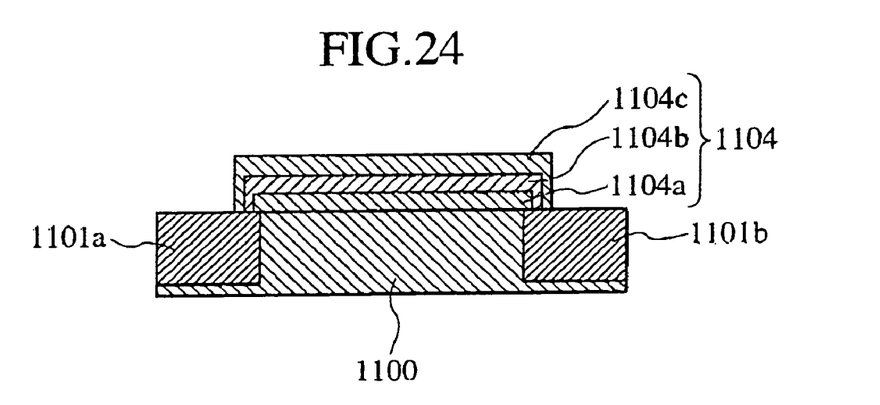
FIG. 24 is a fragmentary cross sectional view of a semiconductor substrate and a deposited film formed thereon in a manufacturing process of a method of manufacturing a transistor according to a third embodiment of the invention.

Then, the semiconductor substrate 1100 is set in a reaction vessel of a low-pressure CVD apparatus. Then, as shown in FIG. 24, an amorphous semiconductor laminate film 1104 having no atom arrangement inherent to crystals is deposited selectively in an active region 1103 partitioned by the insulating films for device isolation 1101a and 1101b (Step 1001). Specifically, an amorphous semiconductor laminate film 1104 is formed, in which an amorphous silicon germanium film 1104b of about 30 nm thickness is incorporated between the amorphous silicon films 1104a and 1104c of about 10 nm thickness. To form the amorphous semiconductor laminate film of such a structure, a silane gas ($SiH_4$) at about 10 (ml/min), a hydrogen gas ($H_2$) at about 1 (l/min), and a hydrogen chloride gas (HCl) at about 5 (ml/min) are supplied on the semiconductor substrate 1100 while keeping the atmosphere in the reaction vessel to about 133 Pa and at about 560° C., thereby depositing an amorphous silicon film 1104a of about 10 nm thickness selectively in the active region of the semiconductor substrate 1100. Then, while keeping the atmosphere in the reaction vessel at about 133 Pa and at about 450° C., a silane gas ($SiH_4$) at about 10 (ml/min), a hydrogen gas ($H_2$) at about 1 (l/min), germane gas ($GeH_4$) at about 0.5 (ml/min), and a hydrogen chloride (HCl) gas at about 5 (ml/min) were supplied, thereby depositing an amorphous silicon germanium film 1104b of about 30 nm thickness selectively on the amorphous silicon film 1104a. Further, the amorphous silicon film 1104c of about 10 nm thickness is selectively deposited on the amorphous silicon germanium film 1104b under the same film deposition conditions as those in a case of depositing the amorphous silicon film 1104a at the lowermost layer. Thus, the amorphous semiconductor laminate film 1104 is formed.

Then, a heat treatment for about 2 min is applied in a nitrogen atmosphere at about 650° C. for about 2 min to conduct solid phase growing for each of constituent layers of the amorphous semiconductor laminate film 1104 (Step 1102). Since the semiconductor laminate film 1104 after solid phase growing naturally retains the shape before solid phase growing, facets are not present at the ends thereof.

Figure 25:
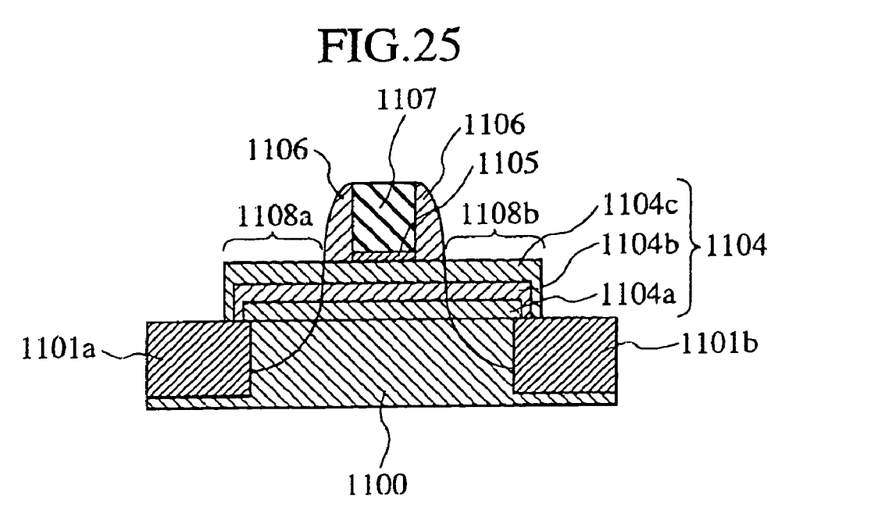
FIG. 25 is a fragmentary cross sectional view of a strained silicon channel transistor in a manufacturing process of a method of manufacturing transistor according to a third embodiment.

Then, a silicon oxide film of about 2.5 nm thickness to serve as a gate oxide film (1105 in FIG. 25) is deposited on the semiconductor laminate film 1104 after solid phase growing, for example, by a thermal oxidation method. Further, a polycrystal silicon film of about 150 nm thickness is deposited on the gate oxide film 1105, for example, by a CVD method. Then, a resist pattern is formed on the polycrystal silicon film by photolithography and, further, the polycrystal silicon film is patterned into a gate electrode shape by dry etching using the resist pattern as a mask. Then, the resist pattern is removed so that a gate electrode (1107 in FIG. 25) is formed on the gate oxide film 1105. Then, a silicon oxide film of about 100 nm thickness is deposited, for example, by a CVD method, and the silicon oxide film is fabricated by anisotropic dry etching. By the fabrication, the silicon oxide film on the side wall of the gate electrode 1107 remains as a side wall spacer 1106 as shown in FIG. 25. Further, when n-type diffusion layers 1108a and 1108b serving as source and drain regions are formed on both lateral regions of the gate portion by implantation of phosphorus ions, etc, whereby a strained silicon channel transistor is completed (Step 1103).

According to the method of manufacturing the transistor described above, since the amorphous semiconductor laminate film not having the atom arrangement inherent to crystals is deposited in the active region and is crystallized, decrease of the transistor forming region can be prevented. Therefore, the integration degree of the transistor can be improved.

When a strained silicon channel transistor of 0.07 μm width was actually manufactured in accordance with the method of manufacturing the transistor as described above, it has been confirmed that a high speed operation at a mobility of 800 $cm^2/V \cdot s$ at a room temperature of 300K was attained.

In this embodiment, while the amorphous semiconductor laminate film is formed as a three-layered structure, it may be of a two-layered structure, or 4 or more multi-layered structure.

Further, while only the silane gas, germane gas, hydrogen gas and hydrogen chloride gas are used as the starting material gas for the amorphous silicon germanium film in this embodiment, other gases may also be added optionally to the gases described above. For example, when a propane gas is further added to the starting material gas for the amorphous silicon germanium film as described previously, the amorphous silicon germanium film containing carbon is formed. Accordingly, stresses formed in the silicon germanium film after solid phase growing can be moderated. As a result, since occurrence of crystal defects in the silicon germanium film after solid phase growing is suppressed, the reliability of the strained silicon channel transistor can be improved further.

Further, while the germanium compositional ratio X of the amorphous silicon germanium film ($Si_{1-x}Ge_x$) is set to 0.4 in this embodiment, an amorphous silicon germanium film at a germanium compositional ratio different therefrom may also be deposited. In such a case, in the same manner as described above, it is necessary that a crystallization temperature T for amorphous silicon germanium having the same germanium compositional ratio as the germanium compositional ratio X for the amorphous silicon germanium film ($Si_{1-x}Ge_x$) to be deposited on the source and drain regions is determined from FIG. 16 and a temperature lower than the crystallization temperature is set as a film deposition temperature of amorphous silicon germanium film.

INDUSTRIAL APPLICABILITY

As described above according to the present invention, a novel method of manufacturing a semiconductor device with no facets is provided. Further, a semiconductor device having a novel structure manufactured by the novel manufacturing method is provided.

The invention claimed is:

1. A method of manufacturing a transistor including:
   a laminate film forming treatment of forming on a first surface of a semiconductor substrate a laminate film in which a semiconductor film is interposed between a first oxide film and a second oxide film;
   an opening forming treatment of forming an opening reaching the first surface of the semiconductor substrate in the laminate film;
   an amorphous semiconductor film forming treatment of supplying a starting material gas containing germanium to the first surface of the semiconductor substrate, thereby forming an amorphous semiconductor film containing the germanium in the opening so as to overlie the exposed portion of the first surface of the semiconductor substrate; and
   a crystallizing treatment of crystallizing the amorphous semiconductor film.

2. A method of manufacturing a transistor as defined in claim 1, wherein a starting material gas containing carbon is supplied, in the amorphous semiconductor film forming treatment, thereby forming an amorphous semiconductor film containing the carbon.

* * * * *